(12) United States Patent
Ma et al.

(10) Patent No.: US 12,557,476 B2
(45) Date of Patent: Feb. 17, 2026

(54) DISPLAY SUBSTRATE AND MANUFACTURING METHOD THEREFOR, AND DISPLAY DEVICE

(71) Applicant: BOE TECHNOLOGY GROUP CO., LTD., Beijing (CN)

(72) Inventors: Kun Ma, Beijing (CN); Xiaojin Zhang, Beijing (CN); Dan Wang, Beijing (CN); Meng Zhao, Beijing (CN); Rongrong Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 757 days.

(21) Appl. No.: 17/772,449

(22) PCT Filed: Jun. 16, 2021

(86) PCT No.: PCT/CN2021/100444
§ 371 (c)(1),
(2) Date: Apr. 27, 2022

(87) PCT Pub. No.: WO2021/254405
PCT Pub. Date: Dec. 23, 2021

(65) Prior Publication Data
US 2023/0006008 A1     Jan. 5, 2023

(30) Foreign Application Priority Data

Jun. 17, 2020   (CN) .......................... 202010556461.2

(51) Int. Cl.
*H10K 59/122*   (2023.01)
*H10K 59/12*    (2023.01)
(Continued)

(52) U.S. Cl.
CPC ......... *H10K 59/122* (2023.02); *H10K 59/126* (2023.02); *H10K 59/874* (2023.02); *H10K 59/1201* (2023.02)

(58) Field of Classification Search
CPC ... H10K 59/874; H10K 59/122; H10K 59/126
See application file for complete search history.

(56) References Cited

U.S. PATENT DOCUMENTS 5,977,212 A  * 11/1999  Ebner .................. B65D 81/266
                                                        523/210
7,315,115 B1 *  1/2008  Curtin .................... H01J 29/94
                                                        313/553
(Continued)

FOREIGN PATENT DOCUMENTS

CN      108539045 A      9/2018
CN      108630829 A   * 10/2018   ......... H01L 27/3246
(Continued)

OTHER PUBLICATIONS

Office Action for the Chinese Patent Application No. 202010556461.2 issued by the Chinese Patent Office on Mar. 28, 2022.

*Primary Examiner* — Steven B Gauthier
*Assistant Examiner* — E. Rhett Cheek
(74) *Attorney, Agent, or Firm* — XSENSUS LLP

(57) ABSTRACT

A display substrate includes a backplane, a pixel defining layer, a gas absorption layer, and light-emitting layers. The pixel defining layer is disposed on a side of the backplane, and has a plurality of openings. The gas absorption layer is disposed on a side of the pixel defining layer away from the backplane, and is configured to absorb a gas generated by the pixel definition layer due to an action of ultraviolet rays. The gas absorption layer exposes at least part of regions of (Continued)

the plurality of openings. The light-emitting layers are each at least partially located in an opening in the plurality of openings.

13 Claims, 10 Drawing Sheets

(51) Int. Cl.
  *H10K 59/126* (2023.01)
  *H10K 59/80* (2023.01)

(56) References Cited

U.S. PATENT DOCUMENTS

| | | | | |
|---|---|---|---|---|
| 2002/0190643 A1* | 12/2002 | Cummings | .......... | C09K 11/642 313/553 |
| 2005/0139839 A1* | 6/2005 | Park | .......... | H10K 59/38 257/40 |
| 2012/0261698 A1* | 10/2012 | Shiozaki | .......... | H10K 50/858 257/E51.001 |
| 2014/0145585 A1* | 5/2014 | Choi | .......... | H10K 59/874 445/24 |
| 2015/0048330 A1* | 2/2015 | Kang | .......... | H10K 50/81 257/40 |
| 2016/0104860 A1 | 4/2016 | Yasukawa et al. | | |
| 2016/0276623 A1* | 9/2016 | Onimaru | .......... | H10K 59/874 |
| 2017/0084675 A1* | 3/2017 | Yoon | .......... | H10K 59/12 |
| 2018/0062116 A1* | 3/2018 | Park | .......... | H10K 59/80521 |
| 2019/0165316 A1* | 5/2019 | An | .......... | H10K 59/38 |
| 2019/0280064 A1 | 9/2019 | Kim et al. | | |
| 2019/0326552 A1* | 10/2019 | Jin | .......... | H10K 59/873 |
| 2020/0303671 A1 | 9/2020 | Song | | |
| 2023/0047411 A1* | 2/2023 | Kawada | .......... | H10H 20/8512 |

FOREIGN PATENT DOCUMENTS

| | | | | |
|---|---|---|---|---|
| CN | 110246980 A | | 9/2019 | |
| CN | 110634924 A | * | 12/2019 | .......... H10K 59/122 |
| CN | 111653684 A | | 9/2020 | |

\* cited by examiner

DISPLAY SUBSTRATE AND MANUFACTURING METHOD THEREFOR, AND DISPLAY DEVICE

This application is a national phase entry under 35 USC 371 of International Patent Application No. PCT/CN 2021/100444 filed on Jun. 16, 2021, which claims priority to Chinese Patent Application No. 202010556461.2, filed on Jun. 17, 2020, which are incorporated herein by reference in their entirety.

TECHNICAL FIELD

The present disclosure relates to the field of display technologies, and in particular, to a display substrate and a manufacturing method therefor, and a display device.

BACKGROUND

Organic light-emitting diodes (OLEDs) have been widely used in the display field due to their advantages of self-luminescence, low driving voltage, high luminous efficiency, fast response speed and flexible display.

SUMMARY

In an aspect, a display substrate is provided. The display substrate includes a backplane, a pixel defining layer, a gas absorption layer and light-emitting layers. The pixel defining layer is disposed on a side of the backplane, and the pixel defining layer has a plurality of openings. The gas absorption layer is disposed on a side of the pixel defining layer away from the backplane. The gas absorption layer is configured to absorb a gas generated by the pixel defining layer due to an action of ultraviolet rays. The gas absorption layer exposes at least part of regions of the plurality of openings. The light-emitting layers are each at least partially located in an opening in the plurality of openings.

In some embodiments, an orthographic projection of the gas absorption layer on the backplane is within an orthographic projection of the pixel defining layer on the backplane.

In some embodiments, an orthographic projection of the gas absorption layer on the backplane substantially coincides with an orthographic projection of the pixel defining layer on the backplane.

In some embodiments, a material of the gas absorption layer includes at least one of ethylene/methyl acrylate/cyclohexenyl acrylate terpolymer, maleic anhydride esterified compound and ethylene diaminetetraacetic acid ferrous salt.

In some embodiments, a thickness of the gas absorption layer in a direction perpendicular to the backplane is in a range of approximately 0.05 µm to approximately 0.5 µm.

In some embodiments, the display substrate further includes a light absorption layer disposed on a side of the gas absorption layer away from the backplane. An orthographic projection of the light absorption layer on the backplane is within an orthographic projection of the gas absorption layer on the backplane, or an orthographic projection of the light absorption layer on the backplane substantially coincides with an orthographic projection of the gas absorption layer on the backplane.

In some embodiments, the orthographic projection of the light absorption layer on the backplane is non-overlapped with orthographic projections of the light-emitting layers on the backplane.

In some embodiments, a material of the light absorption layer includes at least one of an acrylate prepolymer, an ultraviolet absorbent and titanium dioxide.

In some embodiments, a thickness of the light absorption layer in a direction perpendicular to the backplane is in a range of approximately 0.05 µm to approximately 0.5 µm.

In another aspect, a manufacturing method of a display substrate is provided.

The manufacturing method includes: manufacturing a backplane; forming a pixel defining layer on a side of the backplane, the pixel defining layer having a plurality of openings; forming a gas absorption layer on a side of the pixel defining layer away from the backplane, the gas absorption layer being configured to absorb a gas generated by the pixel defining layer due to action of ultraviolet rays, and the gas absorption layer exposing at least part of regions of the plurality of openings; and forming light-emitting layers on a side of the gas absorption layer away from the backplane, the light-emitting layers being each at least partially located in an opening in the plurality of openings.

In some embodiments, an orthographic projection of the gas absorption layer on the backplane is within an orthographic projection of the pixel defining layer on the backplane, or an orthographic projection of the gas absorption layer on the backplane substantially coincides with an orthographic projection of the pixel defining layer on the backplane.

In some embodiments, forming the gas absorption layer, includes: forming a sacrificial layer and a photoresist layer sequentially on the side of the pixel defining layer away from the backplane; patterning the sacrificial layer and the photoresist layer to remove a portion of the pixel defining layer and a portion of the photoresist layer that cover the pixel defining layer, so that portions of the sacrificial layer respectively located in the plurality of openings and portions of the photoresist layer respectively located in the plurality of openings are retained; forming a gas absorption film on a side of a retained photoresist layer after patterning away from the backplane and the side of the pixel defining layer away from the backplane; and peeling off a retained sacrificial layer after patterning to remove the retained sacrificial layer after patterning, the retained photoresist layer after patterning, and portions of the gas absorption film respectively located in the plurality of openings, so as to obtain the gas absorption layer.

In some embodiments, the manufacturing method further includes: forming a light absorption layer on the side of the gas absorption layer away from the backplane before the light-emitting layers are formed.

In some embodiments, forming the gas absorption layer and the light absorption layer, includes: forming a sacrificial layer and a photoresist layer sequentially on the side of the pixel defining layer away from the backplane; patterning the sacrificial layer and the photoresist layer to remove a portion of the sacrificial layer and a portion of the photoresist layer that cover the pixel defining layer, so that portions of the sacrificial layer respectively located in the plurality of openings and portions of the photoresist layer respectively located in the plurality of openings are retained; forming a gas absorption film and a light absorption film sequentially on a side of a retained photoresist layer after patterning away from the backplane and the side of pixel defining layer away from the backplane; and peeling off a retained sacrificial layer after patterning to remove the retained sacrificial layer after patterning, the retained photoresist layer after patterning, and portions of the gas absorption film respectively located in the plurality of openings and portions of the light absorption film respectively located in the plurality of openings, so as to obtain the gas absorption layer and the light absorption layer.

In yet another aspect, a display device is provided. The display device includes the display substrate in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below, Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
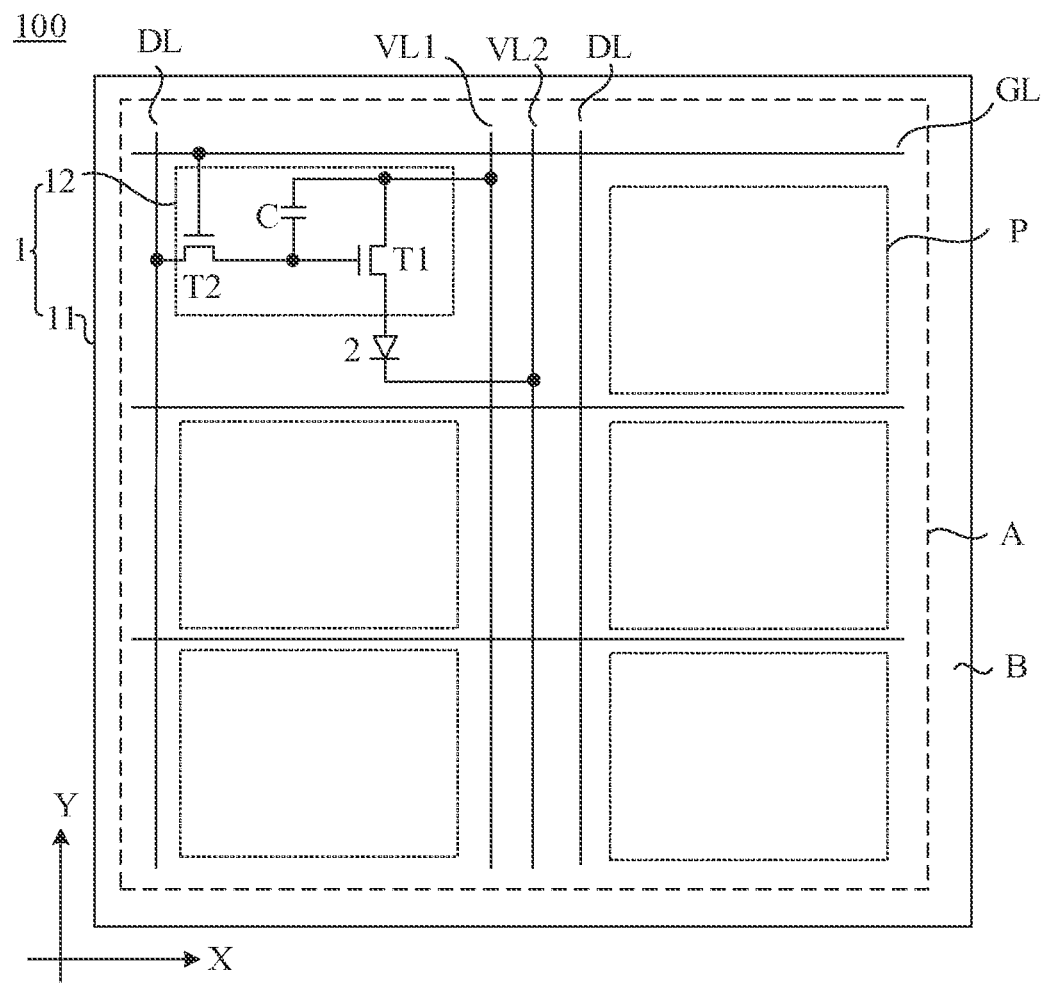
FIG. 1 is a structural diagram of a display substrate, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, but are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and extensions thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of "applicable to" or "configured to" herein means an open and inclusive expression, which does not exclude devices that are applicable to or configured to perform additional tasks or steps.

Additionally, the use of the phase "based on" is meant to be open and inclusive, since a process, step, calculation or other action that is "based on" one or more of the stated conditions or values may, in practice, be based on additional conditions or values exceeding those stated.

The term such as "approximately" or "substantially" as used herein includes a stated value and an average value within an acceptable range of deviation of a particular value determined by a person of ordinary skill in the art, considering measurement in question and errors associated with measurement of a particular quantity (i.e., limitations of a measurement system). The phase "substantially coincide" includes an absolute coincidence and an approximate coincidence. Here, for the approximate coincidence, an acceptable deviation range may be, for example, a deviation range within five percent of an area of the absolute coincidence. In addition, the term "approximately" may mean, for example, the stated value, or ten percent fluctuation above or below the stated value.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display substrate 100. As shown in FIG. 1, the display substrate 100 has a display area A and a bezel area B located on at least one side of the display area A.

In some examples, as shown in FIG. 1, the bezel area B is located on a periphery of the display area A, and is arranged around the display area A. In some other examples, the bezel area B is located on a part of the periphery of the display area A, and is not arranged around the display area A. For example, the bezel area B is located on two opposite sides of the display area A. For another example, the bezel area B is located on two adjacent sides of the display area A. For yet another example, the bezel area B is located only on a side of the display area A.

In some embodiments, as shown in FIGS. 1 to 4, the display substrate 100 includes a backplane 1.

In some examples, as shown in FIG. 1, the backplane 1 includes a substrate 11 and a plurality of pixel driving circuits 12 disposed on a side of the substrate 11. For example, the display area A includes a plurality of sub-pixel regions P, and each sub-pixel region P is provided with, for example, a pixel driving circuit 12 therein.

A structure of the substrate 11 varies, which may be set according to actual needs. For example, the substrate 11 is only a base substrate. For another example, the substrate 11 includes a base substrate and a functional thin film disposed on the base substrate. The functional thin film includes, for example, a buffer layer.

A type of the base substrate varies, which may be specifically set according to actual needs.

For example, the base substrate may be a rigid base substrate. The rigid base substrate may be, for example, a glass base substrate or a polymethyl methacrylate (PMMA) base substrate. In this case, the display substrate 100 may be a rigid display substrate.

For another example, the base substrate may be a flexible base substrate. The flexible base substrate may be, for example, a polyethylene terephthalate (PET) base substrate, a polyethylene naphthalate two formic acid glycol ester (PEN) base substrate or a polyimide (PI) base substrate. In this case, the display substrate 100 may be a flexible display substrate.

A structure of the pixel driving circuit 12 may vary, which may be set according to actual needs. For example, the pixel driving circuit 12 may include a structure such as "2T1C," "6T1C," "7T1C," "6T2C" or "7T2C". Here, "T" represents a thin film transistor, the number before "T" represents the number of thin film transistors, "C" represents a storage capacitor, and the number before "C" represents the number of storage capacitors. One of a plurality of thin film transistors included in the pixel driving circuit 12 is a driving transistor.

As shown in FIG. 1, for convenience of description, as an example, the plurality of sub-pixel regions P are arranged in an array in some examples of the present disclosure. In this case, for example, sub-pixel regions P arranged in a line in a first direction X are referred to as a same row of sub-pixel regions P, and sub-pixel regions P arranged in a line in a second direction Y are referred to as a same column of sub-pixel regions P. Pixel driving circuits 12 in a same row of sub-pixel regions P may be electrically connected to a gate line GL, and pixel driving circuits 12 in a same column of sub-pixel regions P may be electrically connected to a data line DL. Here, the pixel driving circuits 12 in the same column of sub-pixel regions P may be further electrically connected to other signal line(s), which is not limited. For example, the pixel driving circuits 12 in the same column of sub-pixel regions P may be further electrically connected to a first voltage signal line VL1 for transmitting a voltage drain drain (VDD) signal, or a second voltage signal line VL2 for transmitting a voltage source source (VSS) signal.

Figure 2:
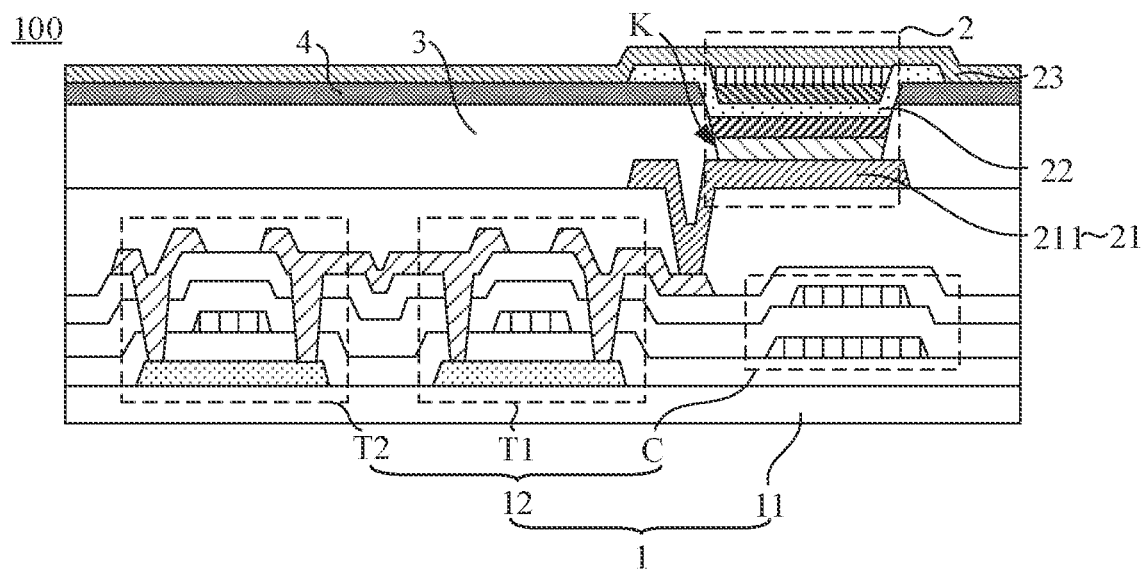
FIG. 2 is a structural diagram of another display substrate, in accordance with some embodiments of the present disclosure.
Figure 3:
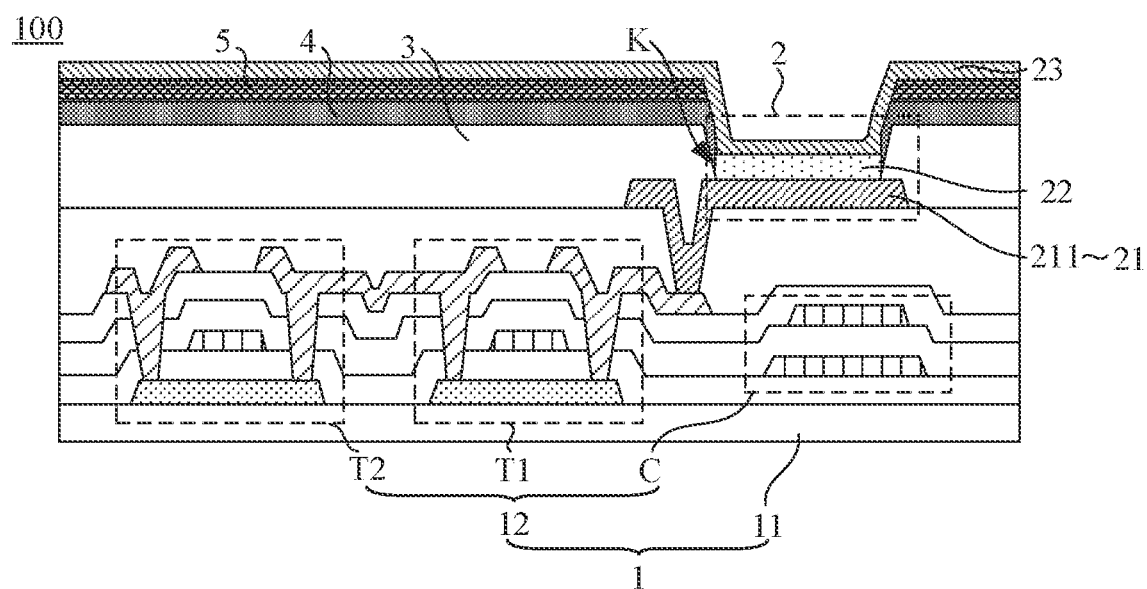
FIG. 3 is a structural diagram of yet another display substrate, in accordance with some embodiments of the present disclosure.
Figure 4:
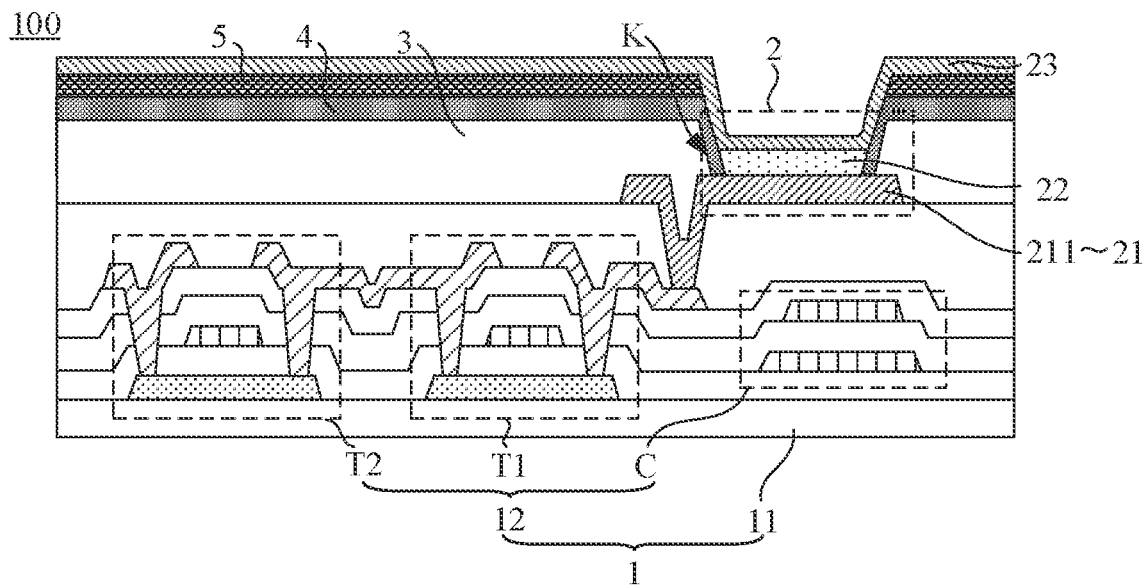
FIG. 4 is a structural diagram of yet another display substrate, in accordance with some embodiments of the present disclosure.

As shown in FIGS. 2 to 4, a structure of the display substrate 100 will be schematically described in an example where the pixel driving circuit 12 is of the "2T1C" structure (that is, the pixel driving circuit 12 includes a driving transistor T1, a switching transistor T2 and a storage capacitor C).

Here, at least one of the driving transistor T1 and the switching transistor T2 may be a top-gate thin film transistor or a bottom-gate thin film transistor. Below, as an example, the driving transistor T1 and the switching transistor T2 are top-gate thin film transistors.

In some embodiments, as shown in FIGS. 2 to 4, the display substrate 100 further includes a plurality of OLED light-emitting devices 2 disposed on a side of the plurality of pixel driving circuits 12 away from the substrate 11, and the plurality of OLED light-emitting devices 2 are electrically connected to the plurality of pixel driving circuits 12, respectively. That is, the plurality of pixel driving circuits 12 may be electrically connected to the plurality of OLED light-emitting devices 2 in one-to-one correspondence.

In some examples, as shown in FIGS. 2 to 4, the OELD light-emitting devices 2 include a first electrode layer 21, light-emitting layers 22 and a second electrode layer 23 that are sequentially stacked in a direction away from the backplane 1. The first electrode layer 21 includes a plurality of first electrodes 211, and each pixel driving circuit 12 may be electrically connected to a first electrode 211 corresponding to the pixel driving circuit 12.

Referring to FIGS. 1 to 4, for example, in a case where each pixel driving circuit 12 is further electrically connected to a first voltage signal line VL1 for transmitting a VDD signal, the first electrode layer 21 may be an anode layer, and the second electrode layer 23 may be a cathode layer. In this case, the second electrode layer 23 may be electrically connected to the second voltage signal line VL2 for transmitting the VSS signal. For another example, in a case where each pixel driving circuit 12 is further electrically connected to a second voltage signal line VL2 for transmitting a VSS signal, the first electrode layer 21 may be a cathode layer, and the second electrode layer 23 may be an anode layer. In this case, the second electrode layer 23 may be electrically connected to the first voltage signal line VL1 for transmitting the VDD signal.

Therefore, each pixel driving circuit 12 may cooperate with a voltage signal line corresponding to the pixel driving circuit 12, so as to control a light-emitting state of an OLED light-emitting device 2 corresponding to the pixel driving circuit 12.

In addition, for example, at least two second electrodes in the second electrode layer 23 may be connected to each other. For example, all second electrodes in the second electrode layer 23 are connected to each other, and have an integrative structure.

In some examples, the OLED light-emitting device 2 may further include one or more of an electron transporting layer (ETL), an electron injection layer (EIL), a hole transporting layer (HTL) and a hole injection layer (HIL). For example, the OLED light-emitting device 2 further includes the hole injection layer and/or the hole transporting layer disposed between the anode layer and the light-emitting layer 22, and the electron injection layer and/or the electron transporting layer disposed between the cathode layer and the light-emitting layer 22.

In a case where the hole injection layer and the hole transporting layer are provided between the anode layer and the light-emitting layer 22, the hole injection layer is located on a side of the hole transporting layer proximate to the anode layer.

In a case where the electron injection layer and the electron transporting layer are provided between the cathode layer and the light-emitting layer 22, the electron injection layer is provided on a side of the electron transporting layer proximate to the cathode layer.

In some examples, hole injection layers, hole transporting layers, electron injection layers or electron transporting layers may be arranged in a whole layer.

In some embodiments, as shown in FIGS. 2 to 4, the display substrate 100 further includes a pixel defining layer 3 disposed on a side of the backplane 1.

In some examples, the pixel defining layer 3 is located on a side of the plurality of first electrodes 211 away from the substrate 11. That is, compared to the plurality of first electrodes 211, the pixel defining layer 3 may be formed in a later manufacturing process.

In some examples, as shown in FIGS. 2 to 4, the pixel defining layer 3 has a plurality of openings K. For example, in an actual manufacturing process of the pixel defining layer 3, each opening K in the pixel defining layer 3 may have an inverted trapezoidal shape as shown in FIGS. 2 to 4.

For example, the plurality of openings K may be in one-to-one correspondence with the plurality of first electrodes 211 in the plurality of OLED light-emitting devices 2. An orthographic projection of a side edge of each of at least one opening K away from the backplane 1 on the substrate 11 is in contact with an orthographic projection of a corresponding first electrode 211 on the substrate 11. Alternatively, an orthographic projection of an edge of each of at least one opening K (e.g., including a side edge of each of the at least one opening K away from the backplane 1 and a side edge of each of the at least one opening K proximate to the backplane 1) on the substrate 11 is within an orthographic projection of a corresponding first electrode 211 on the substrate 11.

It will be noted that "in contact with" may mean that a pattern of the orthographic projection of the side edge of each of the at least one opening K away from the backplane 1 is just in contact with an edge of a pattern of the orthographic projection of the corresponding first electrode 211. In this case, the edge portions in contact substantially coincide. For example, the pattern formed by the orthographic projection of the side edge of each of the at least one opening K away from the backplane 1 on the substrate 11 is just in contact with the edge of the pattern of the orthographic projection of the corresponding first electrode 211 on the substrate 11.

In some examples, the plurality of openings K may be in one-to-one correspondence with the light-emitting layers 22 corresponding to the plurality of OLED light-emitting devices 2, and a light-emitting layer 22 corresponding to an OLED light-emitting device 2 is at least partially located in an opening K.

A positional relationship of the light-emitting layer 22 and the opening K varies, which is related to a manufacturing process of the light-emitting layer 22.

For example, the light-emitting layer 22 may be formed by using an inkjet printing process. In this case, as shown in FIGS. 3 and 4, the light-emitting layer 22 corresponding to the OLED light-emitting device 2 may be entirely located in the opening K corresponding to the OLED light-emitting device 2. In this case, the light-emitting layer 22 may be block-shaped. In this case, light-emitting layers 22 corresponding to at least two of the plurality of OLED light-emitting devices 2 are not connected to each other. For example, the light-emitting layers 22 corresponding to all the OLED light-emitting devices 2 are not connected to each other.

For example, the light-emitting layer 22 may be formed by using an evaporation process. In this case, as shown in FIG. 2, a portion of the light-emitting layer 22 corresponding to the OLED light-emitting device 2 may be located in the opening K corresponding to the OLED light-emitting device 2, and another portion of the light-emitting layer 22 may exceed the opening K to cover the pixel defining layer 3. In this case, the light-emitting layers 22 may be arranged in a whole layer. In this case, the light-emitting layers 22 corresponding to the plurality of OLED light-emitting devices 2 are connected to each other.

In some embodiments, as shown in FIGS. 2 to 4, the display substrate 100 further includes a gas absorption layer 4 disposed on a side of the pixel defining layer 3 away from the backplane 1. The gas absorption layer 4 is configured to absorb a gas generated by the pixel defining layer 3 due to an action of ultraviolet rays. The gas absorption layer 4 exposes at least part of regions of the plurality of openings K. On this basis, the light-emitting layers 22 are each at least partially located in an opening K.

As shown in FIGS. 2 to 4, in a case where an opening K have an inverted trapezoidal shape, an area of a region enclosed by a side edge of the opening K away from the backplane 1 is greater than an area of a region enclosed by a side edge of the opening K proximate to the backplane 1.

For convenience of explanation, whether the gas absorption layer 4 exposes at least a partial region of the opening K will be described based on whether an orthographic projection of the gas absorption layer 4 on the backplane 1 is overlapped with a closed region enclosed by an orthographic projection of the side edge of the opening K proximate to the backplane 1 on the backplane 1. On this basis, in a case where the orthographic projection of the gas absorption layer 4 on the backplane 1 is overlapped with the closed region enclosed by the orthographic projection of the side edge of the opening K proximate to the backplane 1 on the backplane 1, the gas absorption layer 4 exposes a partial region of the opening K. In a case where the orthographic projection of the gas absorption layer 4 on the backplane 1 is non-overlapped with the closed region enclosed by the orthographic projection of the side edge of the opening K proximate to the backplane 1 on the backplane 1, the gas absorption layer 4 exposes an entire region of the opening K.

Based on this, in some examples, the gas absorption layer 4 exposes the entire regions of the plurality of openings K. In this case, a positional relationship of the gas absorption layer 4 and the pixel defining layer 3 varies as follows.

For example, as shown in FIG. 2, the orthographic projection of the gas absorption layer 4 on the backplane 1 is within an orthographic projection of the pixel defining layer 3 on the backplane 1. That is, the gas absorption layer 4 covers only a portion of the pixel defining layer 3. In this case, in a case where the light-emitting layer 22 is entirely located in a corresponding opening K, an orthographic projection of the light-emitting layer 22 on the backplane 1 is non-overlapped with the orthographic projection of the gas absorption layer 4 on the backplane 1. In a case where the portion of the light-emitting layer 22 is located in a corresponding opening K, and the another portion of the light-emitting layer 22 covers the pixel defining layer 3, the orthographic projection of the light-emitting layer 22 on the backplane 1 may be non-overlapped with, in contact with, or partially overlapped with the orthographic projection of the gas absorption layer 4 on the backplane 1.

For another example, as shown in FIG. 3, the orthographic projection of the gas absorption layer 4 on the backplane 1 substantially coincides with the orthographic projection of the pixel defining layer 3 on the backplane 1. That is, the gas absorption layer 4 covers just the entire pixel defining layer. In this case, in the case where the light-emitting layer 22 is entirely located in a corresponding opening K, the orthographic projection of the light-emitting layer 22 on the backplane 1 may be non-overlapped with, or in contact with the orthographic projection of the gas absorption layer 4 on the backplane 1. In the case where the portion of the light-emitting layer 22 is located in a corresponding opening K, and the another portion of the light-emitting layer 22 covers the pixel defining layer 3, the orthographic projection of the light-emitting layer 22 on the backplane 1 may be partially overlapped with the orthographic projection of the gas absorption layer 4 on the backplane 1.

In some other examples, the gas absorption layer 4 exposes part of the regions of the plurality of openings K. That is, the gas absorption layer 4 exposes part of region(s) of at least one of all the openings K. For convenience of description, it is assumed that the total number of all the openings K is M, M is greater than 1 (i.e., M>1), and M is a positive integer. In this case, the gas absorption layer 4 may expose a partial region of each of N opening(s) K. Here, M is greater than or equal to N that is greater than 1 (i.e., M≥N>1)), or M is greater than N that is equal to 1 (i.e., M>N=1), and N is a positive integer. When N is greater than 1 (i.e., N>1), a region position or a region area of each of the N openings K exposed by the gas absorption layer 4 may be same or different, which is not limited.

On this basis, as shown in FIG. 4, an orthographic projection of a portion of the pixel defining layer 3 at each of at least one opening K on the backplane 1 is within an orthographic projection of a portion the gas absorption layer 4 at this opening K on the backplane 1. That is, the portion of the gas absorption layer 4 covers not only the portion of the pixel defining layer 3 completely, but also other component(s) (e.g., the first electrode 211 shown in FIG. 4). In the case where the light-emitting layer 22 is entirely located in a corresponding opening K, the orthographic projection of the light-emitting layer 22 on the backplane 1 may be non-overlapped with, in contact with, or partially overlapped with the orthographic projection of the portion of the gas absorption layer 4 on the backplane 1. In the case where the portion of the light-emitting layer 22 is located in a corresponding opening K, and the another portion of the light-emitting layer 22 covers the pixel defining layer 3, the orthographic projection of the light-emitting layer 22 on the backplane 1 may be partially overlapped with the orthographic projection of the portion of the gas absorption layer 4 on the backplane 1.

Of course, whether the gas absorption layer 4 exposes at least the partial region of the opening K will be described based on whether the orthographic projection of the gas absorption layer 4 on the backplane 1 is overlapped with a closed region enclosed by the orthographic projection of the side edge of the opening K away from the backplane 1 on the backplane 1. On this basis, in a case where the orthographic projection of the gas absorption layer 4 on the backplane 1 is overlapped with the closed region enclosed by the orthographic projection of the side edge of the opening K away from the backplane 1 on the backplane 1, the gas absorption layer 4 exposes the partial region of the opening K. In a case where the orthographic projection of the gas absorption layer 4 on the backplane 1 is non-overlapped with the closed region enclosed by the orthographic projection of the side edge of the opening K away from the backplane 1 on the backplane 1, the gas absorption layer 4 exposes the entire region of the opening K.

Based on this, in some examples, the gas absorption layer 4 exposes the entire regions of the plurality of openings K. In this case, as shown in FIG. 2, the orthographic projection of the gas absorption layer 4 on the backplane 1 is within the orthographic projection of the pixel defining layer 3 on the backplane 1. Moreover, a side wall of the pixel defining layer 3 at the opening K is non-covered by the gas absorption layer 4. In the case where the light-emitting layer 22 is entirely located in a corresponding opening K, the orthographic projection of the light-emitting layer 22 on the backplane 1 is non-overlapped with, or in contact with the orthographic projection of the gas absorption layer 4 on the backplane 1. In the case where the portion of the light-emitting layer 22 is located in a corresponding opening K, and the another portion of the light-emitting layer 22 covers the pixel defining layer 3, the orthographic projection of the light-emitting layer 22 on the backplane 1 may be non-overlapped with, in contact with, or partially overlapped with the orthographic projection of the gas absorption layer 4 on the backplane 1.

In some other examples, the gas absorption layer 4 exposes part of the regions of the plurality of openings K. That is, the gas absorption layer 4 exposes part of region(s) of at least one of all the openings K. For convenience of description, it is assumed that the total number of all the openings K is P, P is greater than 1 (i.e., P>1), and P is a positive integer. In this case, the gas absorption layer 4 may expose a partial region of each of Q openings K. Here, P is greater than or equal to Q that is greater than 1 (i.e., P≥Q>1), or P is greater than Q that is equal to 1 (i.e., P>Q=1), and Q is a positive integer. When Q is greater than 1 (i.e., Q>1), a region position or a region area of each of the Q openings K exposed by the gas absorption layer 4 may be same or different, which is not limited.

For example, as shown in FIG. 3 or 4, a side wall of the pixel defining layer 3 at each of at least one opening K is at least partially covered by the gas absorption layer 4. In this case, the gas absorption layer 4 exposes the part of the regions of the plurality of openings K.

For example, the side wall of the pixel defining layer 3 at each of the at least one opening K is partially covered by the gas absorption layer 4, and in this case, the orthographic projection of the gas absorption layer 4 on the backplane 1 is within the orthographic projection of the pixel defining layer 3 on the backplane 1.

For another example, the side wall of the pixel defining layer 3 at each of the at least one opening K is completely covered by the gas absorption layer 4, and in this case, as shown in FIG. 3, an orthographic projection of a portion of the gas absorption layer 4 at this opening K on the backplane 1 substantially coincides with an orthographic projection of a portion of the pixel defining layer 3 at this opening K on the backplane 1. Alternatively, as shown in FIG. 4, the orthographic projection of the portion of the pixel defining layer 3 on the backplane 1 is within the orthographic projection of the portion of the gas absorption layer 4 on the backplane 1.

On this basis, the relative positional relationship between the light-emitting layer 22 and the gas absorption layer 4 may be set with reference to some of the above examples related to FIG. 3 or 4, and will not be repeated here.

It is found through research that the pixel defining layer 3 is easy to generate a gas such as oxygen ($O_2$) and/or water vapor ($H_2O$) due to an irradiation of ambient light (e.g., including ultraviolet rays). The gas easily erodes the light-emitting layer 22, which reduces an effective light-emitting area of the light-emitting layer 22, and further easily reduces a luminous efficiency of the OLED light-emitting device 2, thereby affecting display effects of an OLED display substrate. The gas absorption layer 4 is provided on the side of the pixel defining layer 3 away from the backplane 1, and the gas absorption layer 4 is able to absorb the gas generated by the pixel defining layer 3 due to the action of the ultraviolet rays, so that the reduction of the luminous efficiency of the OLED light-emitting device 2 caused by the erosion of the gas on the light-emitting layer 22 may be effectively avoided, which is beneficial to improving the display effects of the display substrate 100.

In some examples, when the gas absorption layer 4 is irradiated by the ambient light, free radicals (e.g., including P.) may be generated. The free radicals may react with the gas such as $O_2$ and/or $H_2O$, and capture and absorb the gas such as $O_2$ and/or $H_2O$.

For example, chemical formulas for reactions of the free radicals with $O_2$ and $H_2O$ are as follows:

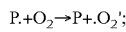

$P.+O_2 \rightarrow P.+O_2';$

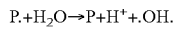

$P.+H_2O \rightarrow P.+H^+ +.OH.$

It can be seen from this that the gas absorption layer 4 may well capture and absorb the gas such as $O_2$ and/or $H_2O$, which is beneficial to avoiding the reduction of the luminous efficiency of the OLED light-emitting device 2 caused by the erosion of the gas on the light-emitting layer 22, so that the display effects of the display substrate 100 may be improved.

It will be noted that in a case where the orthographic projection of the light-emitting layer 22 on the backplane 1 may be partially overlapped with the orthographic projection of the gas absorption layer 4 on the backplane 1, the light-emitting layer 22 and the pixel defining layer 3 may be partially isolated by the gas absorption layer 4, so that a contact area between the light-emitting layer 22 and the pixel defining layer 3 may be reduced, which is beneficial to reducing a probability that the gas such as $O_2$ and/or $H_2O$ generated by the pixel defining layer 3 contacts and erodes the light-emitting layer 22.

Thus, in the display substrate 100 in some embodiments of the present disclosure, the gas absorption layer 4 is provided on the side of the pixel defining layer 3 away from the backplane 1, so that the gas such as $O_2$ and/or $H_2O$ generated by the pixel defining layer 3 due to the irradiation of the ambient light may be captured and absorbed by using the free radicals generated by the gas absorption layer 4 due to the irradiation of the ambient light. In this way, the light-emitting layer 22 may be protected by using the gas absorption layer 4 to reduce or even avoid the erosion of the gas such as $O_2$ and/or $H_2O$ on the light-emitting layer 22, so as to reduce or even avoid the reduction of the effective light-emitting area of the light-emitting layer 22, thereby improving the luminous efficiency of the OLED light-emitting device 2 and the display effects of the display substrate 100.

In some examples, the gas absorption layer 4 is provided on a side surface of the pixel defining layer 3 away from the backplane 1, and the gas absorption layer 4 and the pixel defining layer 3 are in direct contact without any other film disposed therebetween.

In addition, the gas absorption layer 4 may be formed earlier than the light-emitting layers 22.

A material of the gas absorption layer 4 varies, which may be set according to actual needs.

In some embodiments, the material of the gas absorption layer 4 includes at least one of ethylene/methyl acrylate/cyclohexenyl acrylate terpolymer, maleic anhydride esterified compound and ethylene diaminetetraacetic acid ferrous salt.

The thickness (i.e., a dimension of the gas absorption layer 4 in a direction perpendicular to the backplane 1) of the gas absorption layer 4 varies, which may be set according to actual needs.

In some embodiments, the thickness of the gas absorption layer 4 in the direction perpendicular to the backplane 1 is in a range of approximately 0.05 μm to approximately 0.5 μm. For example, the thickness of the gas absorption layer 4 may be 0.045 μm, 0.05 μm, 0.055 μm, 0.1 μm, 0.13 μm, 0.18 μm, 0.2 μm, 0.3 μm, 0.44 μm, 0.45 μm, 0.5 μm or 0.55 μm.

The thickness of the gas absorption layer 4 is set to be in the above range, which is helpful to ensure that the gas absorption layer 4 is able to generate a lot of or enough free radicals when the display substrate 100 is irradiated by the ambient light, so that the gas such as $O_2$ and/or $H_2O$ generated by the pixel defining layer 3 is sufficiently captured and absorbed, which may ensure that the gas absorption layer 4 has a good protection effect on the light-emitting layers 22, and is further beneficial to avoiding a large increase in the thickness of the display substrate 100 due to the gas absorption layer 4.

In some embodiments, as shown in FIGS. 3 and 4, the display substrate 100 further includes a light absorption layer 5 disposed on a side of the gas absorption layer 4 away from the backplane 1. Here, the light absorption layer 5 may be disposed on a side surface of the gas absorption layer 4 away from the backplane 1, and the light absorption layer 5 and the gas absorption layer 4 are in direct contact without any other film disposed therebetween.

For example, the light absorption layer 5 may be formed earlier than the light-emitting layers 22.

Here, a positional relationship of the light absorption layer 5 and the gas absorption layer 4 varies, which may be set according to actual needs.

In some examples, as shown in FIGS. 3 and 4, an orthographic projection of the light absorption layer 5 on the backplane 1 is within the orthographic projection of the gas absorption layer 4 on the backplane 1. That is, the light absorption layer 5 covers only a portion of the gas absorption layer 4.

On this basis, for example, referring to FIGS. 3 and 4 again, the orthographic projection of the light absorption layer 5 on the backplane 1 is within the orthographic projection of the pixel defining layer 3 on the backplane 1, and the light absorption layer covers only a portion of the pixel defining layer 3. For another example, the orthographic projection of the light absorption layer 5 on the backplane 1 substantially coincides with the orthographic projection of the pixel defining layer 3 on the backplane 1, and the light absorption layer 5 covers just the entire pixel defining layer 3. For yet another example, the orthographic projection of the pixel defining layer 3 on the backplane 1 is within the orthographic projection of the light absorption layer 5 on the backplane 1, and the light absorption layer 5 covers the pixel defining layer 3 completely.

In some other examples, the orthographic projection of the light absorption layer on the backplane 1 substantially coincides with the orthographic projection of the gas absorption layer 4 on the backplane 1. That is, the light absorption layer 5 covers just the entire gas absorption layer 4.

For example, the orthographic projection of the light absorption layer 5 on the backplane 1 may be within the orthographic projection of the pixel defining layer 3 on the backplane 1, and the light absorption layer 5 covers only a portion of the pixel defining layer 3. For another example, the orthographic projection of the light absorption layer 5 on the backplane 1 may substantially coincide with the orthographic projection of the pixel defining layer 3 on the backplane 1, and the light absorption layer 5 covers just the entire pixel defining layer 3. For yet another example, the orthographic projection of the pixel defining layer 3 on the backplane 1 may be within the orthographic projection of the light absorption layer 5 on the backplane 1, and the light absorption layer 5 covers the pixel defining layer 3 completely.

It will be noted that the light absorption layer 5 is configured to absorb ultraviolet rays. In this way, when the display substrate 100 is irradiated by the ambient light, the light absorption layer 5 may be used to absorb ultraviolet rays therein, which is beneficial to reducing or even eliminating ultraviolet rays incident on the pixel defining layer 3, so as to reduce the amount of the gas such as $O_2$ and/or $H_2O$ generated by the pixel defining layer 3, and even prevent the pixel defining layer 3 from generating the gas such as $O_2$ and/or $H_2O$, thereby being beneficial to reducing or even avoiding the erosion of the gas such as $O_2$ and/or $H_2O$ on the light-emitting layer 22.

In addition, in a case where the ultraviolet rays incident on the pixel defining layer 3 are not completely absorbed by the light absorption layer 5, the gas absorption layer 4 may further be used to generate the free radicals to capture and absorb the gas such as $O_2$ and/or $H_2O$ generated by the pixel defining layer 3.

Therefore, in the display substrate 100 in some embodiments of the present disclosure, the gas absorption layer 4 and the light absorption layer 5 may cooperate with each other, so that the amount of the ultraviolet rays incident on the pixel defining layer 3 is reduced, and the gas such as $O_2$ and/or $H_2O$ generated by the pixel defining layer 3 is captured and absorbed. Thus, the gas absorption layer 4 and the light absorption layer 5 may together protect the light emitting layer 22, which is beneficial to reducing or even avoiding the erosion of the gas such as $O_2$ and/or $H_2O$ on the light-emitting layer 22, so that the luminous efficiency of the OLED light-emitting device 2 may be improved, which is helpful to improve the display effects of the display substrate 100.

In some examples, as shown in FIG. 3, the orthographic projection of the light absorption layer 5 on the backplane 1 is non-overlapped with the orthographic projection of the light-emitting layer 22 on the backplane 1. For example, the orthographic projection of the light absorption layer 5 on the backplane 1 and the orthographic projection of the light-emitting layer 22 on the backplane 1 may be in contact with each other, or have a distance therebetween.

These arrangements are beneficial to preventing the light-emitting layer 22 from covering the light absorption layer 5, so that the light absorption layer 5 is able to absorb the ultraviolet rays incident on the light absorption layer 5, which is beneficial to improving the absorption effect of the light absorption layer 5 on the ultraviolet rays.

A material of the light absorption layer 5 varies, which may be set according to actual needs.

In some embodiments, the material of the light absorption layer 5 includes at least one of an acrylate prepolymer, an ultraviolet absorbent and titanium dioxide.

For example, the ultraviolet absorbent may include a salicylate ultraviolet absorbent, a benzophenone ultraviolet absorbent, a benzotriazole ultraviolet absorbent, a substituted acrylonitrile ultraviolet absorbent, and a triazine ultraviolet absorbent.

The thickness (i.e., a dimension of the light absorption layer 5 in the direction perpendicular to the backplane 1) of the light absorption layer 5 varies, which may be set according to actual needs.

In some embodiments, the thickness of the light absorption layer 5 in the direction perpendicular to the backplane 1 is in a range of approximately 0.05 µm to approximately 0.5 µm. For example, the thickness of the light absorption layer 5 may be 0.045 µm, 0.05 µm, 0.055 µm, 0.09 µm, 0.13 µm, 0.18 µm, 0.2 µm, 0.3 µm, 0.45 µm, 0.5 µm or 0.55 µm.

The thickness of the light absorption layer 5 is set to be in the above range, which is helpful to ensure that when the display substrate 100 is irradiated by the ambient light, the light absorption layer 5 is able to sufficiently absorb the ultraviolet rays therein, so as to reduce or even avoid the ultraviolet rays incident on the pixel defining layer 3, which is beneficial to ensuring a good ultraviolet ray absorption effect of the light absorption layer 5, and is further beneficial to avoiding a large increase in the thickness of the display substrate 100 due to the light absorption layer 5.

Figure 5:
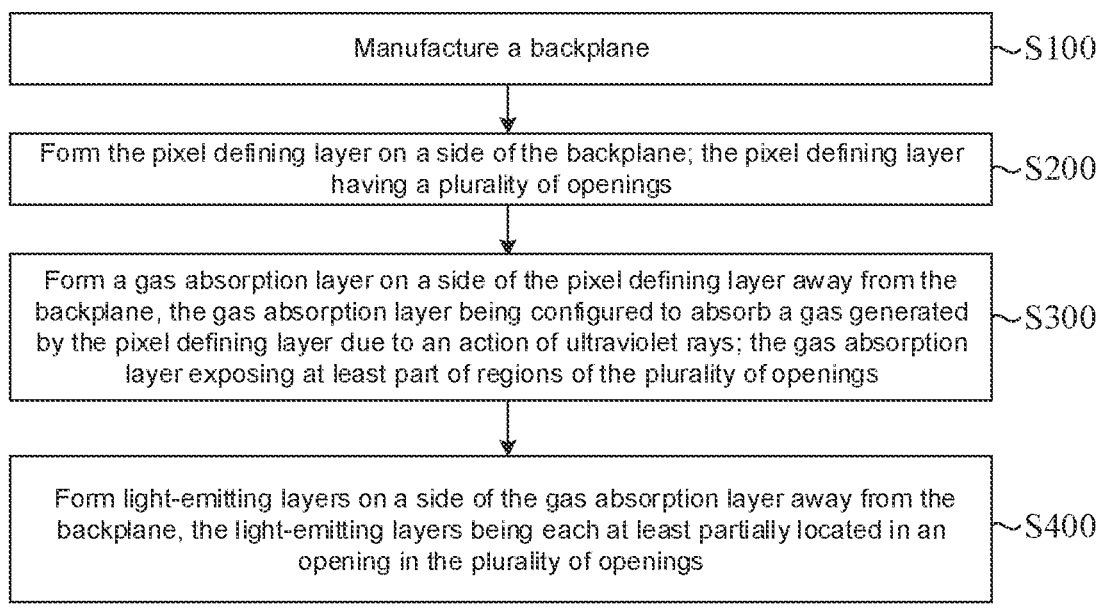
FIG. 5 is a flow diagram of a manufacturing method of a display substrate, in accordance with some embodiments of the present disclosure.

Some embodiments of the present disclosure provide a manufacturing method of a display substrate 100. As shown in FIG. 5, the manufacturing method of the display substrate 100 includes S100 to S400.

Figure 9A:
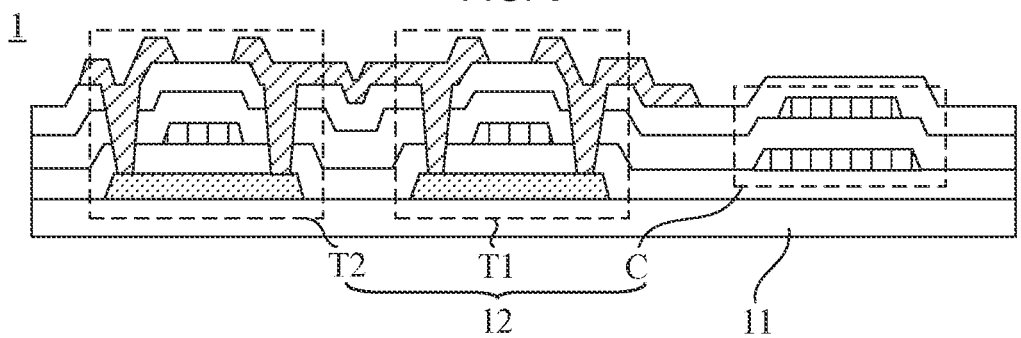
FIGS. 9A to 9G are diagrams showing a process of manufacturing a display substrate, in accordance with some embodiments of the present disclosure.
Figure 9B:
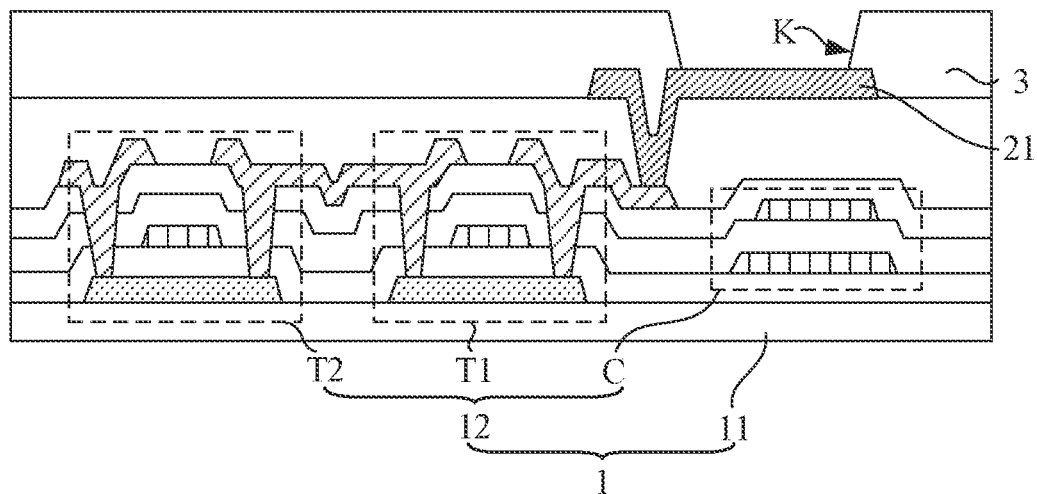

In S100, as shown in FIG. 9A, a backplane 1 is manufactured.

For example, a structure of the backplane 1 may refer to the schematic description of the structure of the backplane 1 in some of the above embodiments, and will not be repeated here.

For example, a process of manufacturing the backplane 1 will be schematically described below in an example where pixel driving circuits 12 included in the backplane 1 are each of the "2T1C" structure, and a driving transistor T1 and a switching transistor T2 in a pixel driving circuit 12 in the pixel driving circuit 12 are top-gate transistors.

Figure 6:
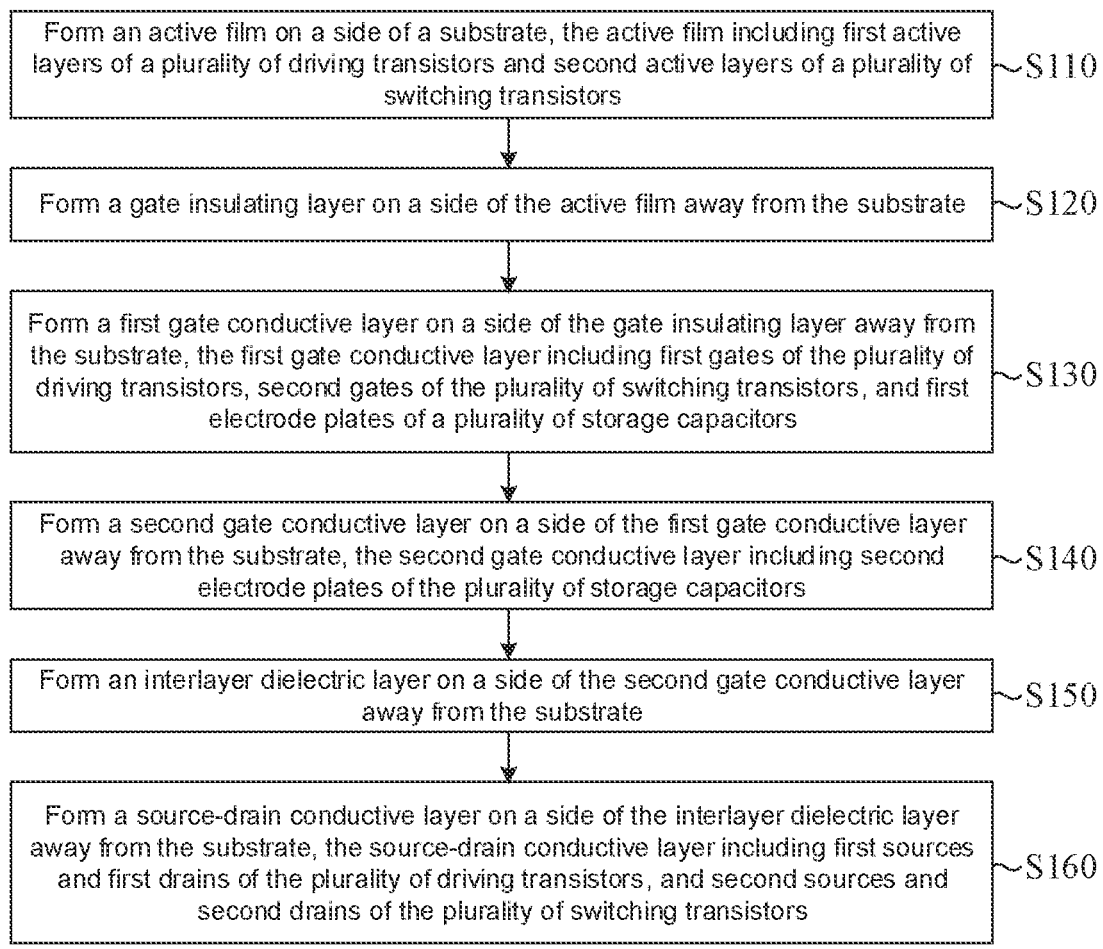
FIG. 6 is a flow diagram of S100 in FIG. 5.

In some examples, as shown in FIG. 6, in S100, manufacturing the backplane 1, includes S110 to S160.

In S110, an active film is formed on a side of a substrate 11. The active film includes first active layers of a plurality of driving transistors T1 and second active layers of a plurality of switching transistors T2.

For example, the active film may be formed by using a plasma enhanced chemical vapor deposition (PECVD) process.

In S120, a gate insulating layer is formed on a side of the active film away from the substrate 11.

For example, the gate insulating layer may be formed by using a PECVD process.

In S130, a first gate conductive layer is formed on a side of the gate insulating layer away from the substrate 11. The first gate conductive layer includes first gates of the plurality of driving transistors T1, second gates of the plurality of switching transistors T2, and first electrode plates of a plurality of storage capacitors C.

For example, the first gate conductive layer may be formed by using a sputter deposition process.

For example, the first gate conductive layer may be made of one of elemental metal materials such as copper (Cu), aluminum (Al), molybdenum (Mo), titanium (Ti), chromium (Cr) and tungsten (W), or a metal alloy material made of at least two elemental metals in the foregoing elemental metal materials.

In S140, a second gate conductive layer is formed on a side of the first gate conductive layer away from the substrate 11. The second gate conductive layer includes second electrode plates of the plurality of storage capacitors C. Each second electrode plate is arranged opposite to a first electrode plate.

For example, the second gate conductive layer may be formed by using a sputter deposition process.

For example, the second gate conductive layer may be made of one of elemental metal materials such as Cu, Al, Mo, Ti, Cr and W, or a metal alloy material made of at least two elemental metals in the foregoing elemental metal materials.

In S150, an interlayer dielectric layer is formed on a side of the second gate conductive layer away from the substrate 11.

For example, the interlayer dielectric layer may be formed by using a PECVD process.

In S160, a source-drain conductive layer is formed on a side of the interlayer dielectric layer away from the substrate 11. The source-drain conductive layer includes first sources and first drains of the plurality of driving transistors T1, and second sources and second drains of the plurality of switching transistors T2.

For example, the source-drain conductive layer may be formed by using a sputter deposition process.

For example, the source-drain conductive layer may be made of copper (Cu), aluminum (Al), or other metal materials.

In some examples, after S160 and before following S200, a planarization layer is formed on a side of the source-drain conductive layer away from the substrate 11, and a first electrode layer 21 is formed on a side of the planarization layer away from the substrate 11. The first electrode layer 21 includes a plurality of first electrodes 211.

Figure 10A:
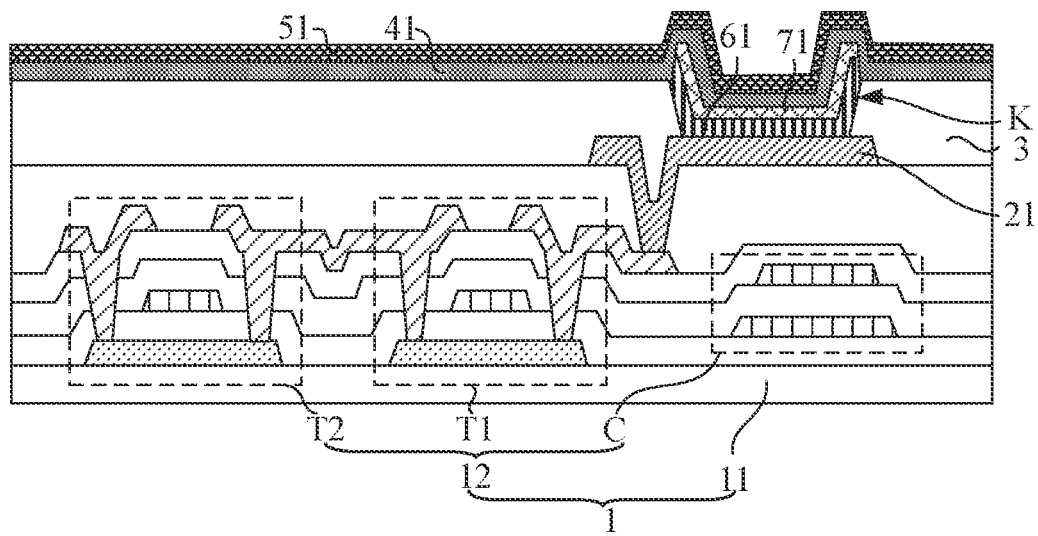
FIGS. 10A and 10B are diagrams showing a process of manufacturing a gas absorption layer and a light absorption layer, in accordance with some embodiments of the present disclosure.
Figure 10B:
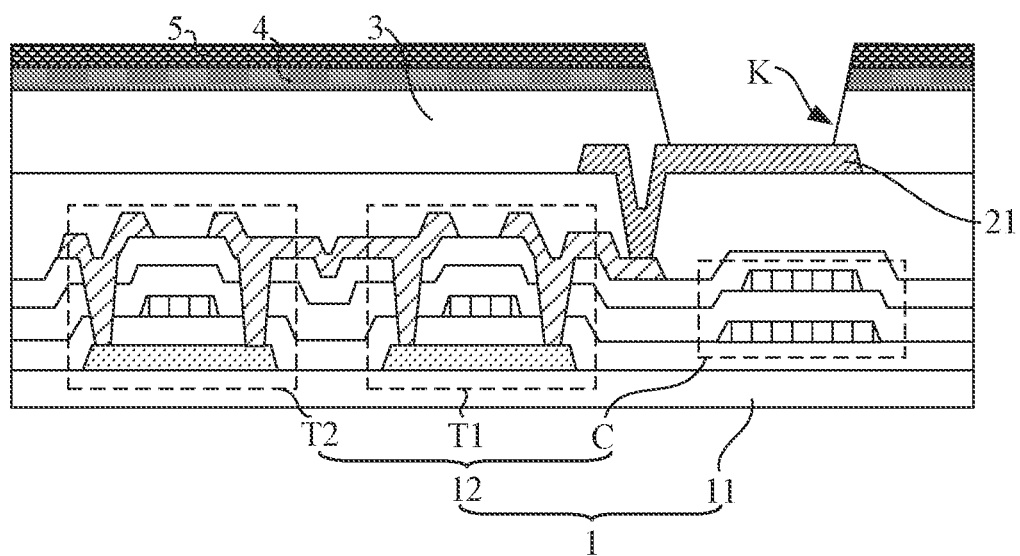

In S200, as shown in FIG. 10B, a pixel defining layer 3 is formed on a side of the backplane 1. The pixel defining layer 3 has a plurality of openings K.

Here, the pixel defining layer 3 may be located on a side of the plurality of first electrodes 211 away from the backplane 1.

For example, a pixel defining film may be formed by using a coating process and a curing process sequentially, and then the plurality of openings K are formed by using a photolithography process, so as to obtain the pixel defining layer 3.

Positional relationships between the plurality of openings K and the plurality of first electrodes 211 may refer to the schematic description in some of the above embodiments, which will not be repeated here.

In S300, a gas absorption layer 4 is formed on a side of the pixel defining layer 3 away from the backplane 1. The gas absorption layer 4 is configured to absorb a gas generated by the pixel defining layer 3 due to an action of ultraviolet rays. The gas absorption layer 4 exposes at least part of regions of the plurality of openings K.

For example, an orthographic projection of the gas absorption layer 4 on the backplane 1 is within an orthographic projection of the pixel defining layer 3 on the backplane 1. For example, the gas absorption layer 4 covers only a planar portion of the pixel defining layer 3 away from the backplane 1 and parallel to the backplane 1. In this case, the gas absorption layer 4 exposes the entire regions of the plurality of openings K.

For another example, the orthographic projection of the gas absorption layer 4 on the backplane 1 coincides with the orthographic projection of the pixel defining layer 3 on the backplane 1.

Figure 7:
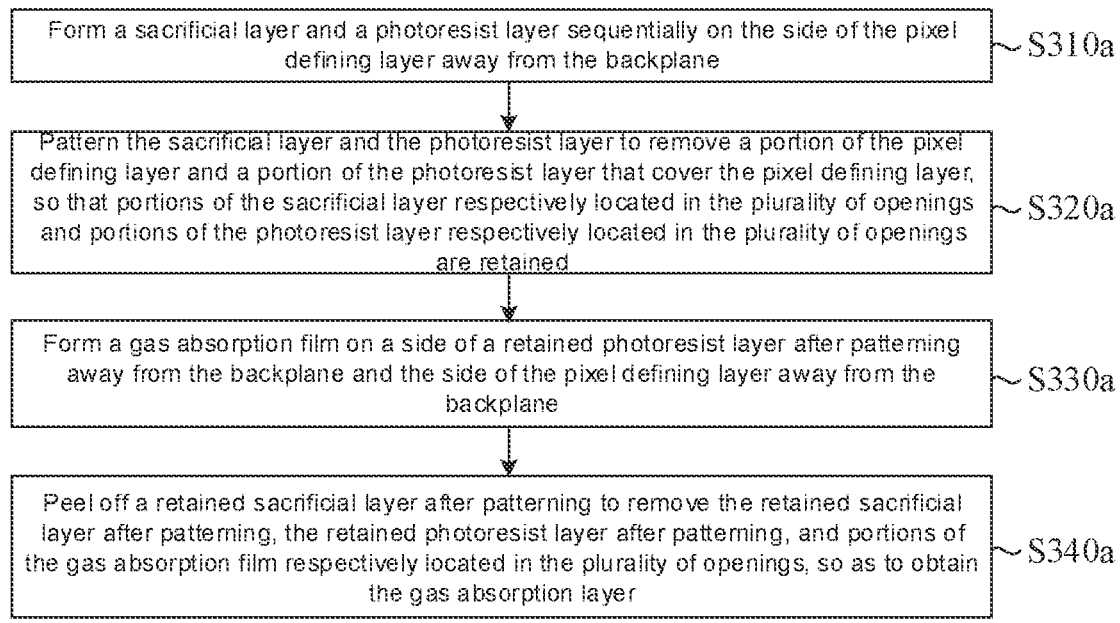
FIG. 7 is a flow diagram of S300 in FIG. 5.

In some examples, as shown in FIG. 7, in S300, forming the gas absorption layer 4, includes S310a to S340a.

Figure 9C:
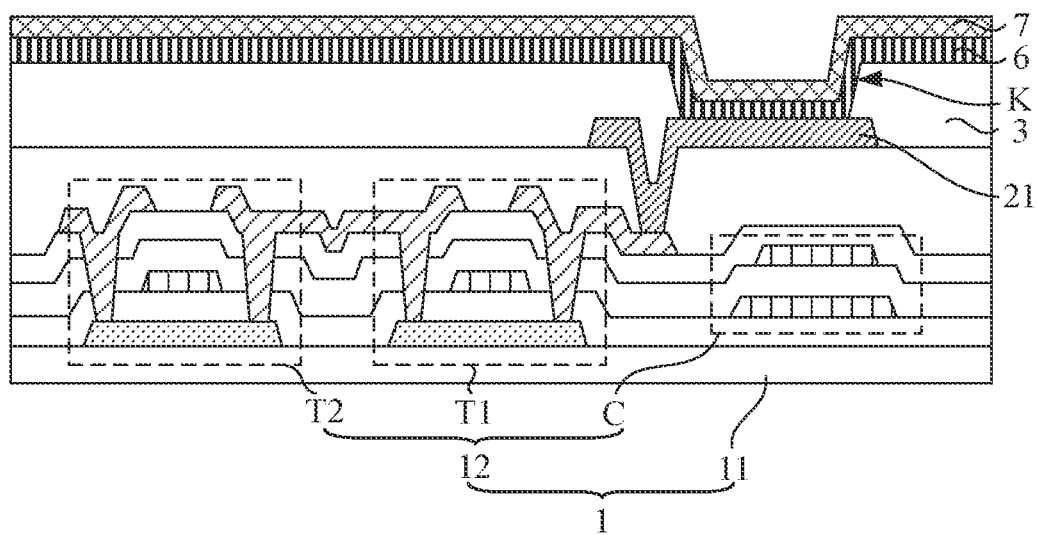

In S310a, as shown in FIG. 9C, a sacrificial layer 6 and a photoresist layer 7 are sequentially formed on the side of the pixel defining layer 3 away from the backplane 1.

A type of a material of the photoresist layer 7 varies, which may be set according to actual needs.

For example, the material of the photoresist layer 7 includes a positive photoresist. In this case, in a case where the photoresist layer 7 is exposed and developed by using a mask, an obtained pattern is the same or substantially the same as a pattern of the mask.

For another example, the material of the photoresist layer 7 includes a negative photoresist. In this case, in a case where the photoresist layer 7 is exposed and developed by using a mask, an obtained pattern is complementary or substantially complementary to a pattern of the mask.

For example, the sacrificial layer 6 and the photoresist layer 7 may be formed by using a coating process.

Figure 9D:
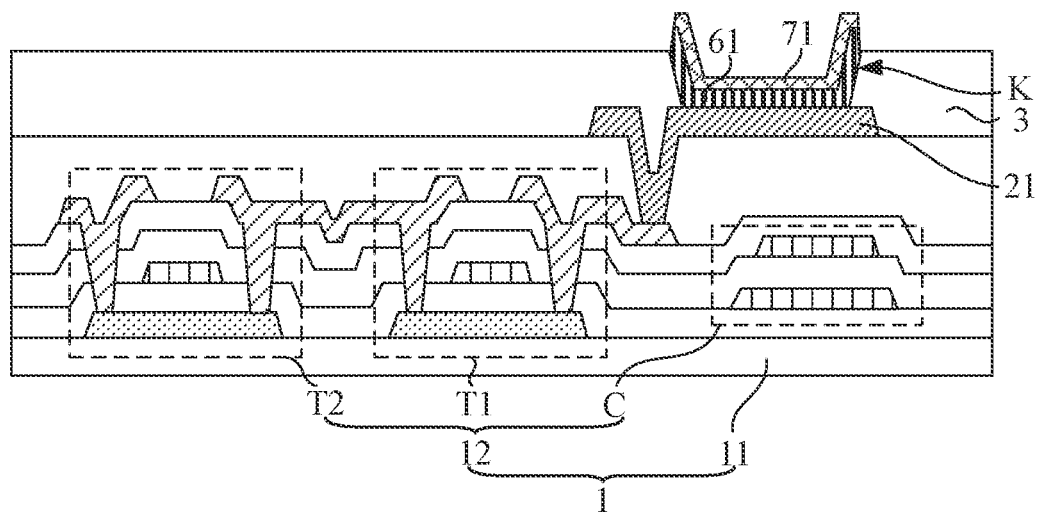

In S320a, as shown in FIG. 9D, the sacrificial layer 6 and the photoresist layer 7 are patterned to remove a portion of the sacrificial layer 6 and a portion of the photoresist layer 7 that cover the pixel defining layer 3, so that portions of the sacrificial layer 6 respectively located in the plurality of openings K and portions of the photoresist layer 7 respectively located in the plurality of openings K are retained.

For example, the sacrificial layer 6 and the photoresist layer 7 may be patterned by using a photolithography process.

Below, in an example where the material of the photoresist layer 7 includes the negative photoresist, S320a includes: providing a mask on a side of the photoresist layer 7 away from the backplane 1; exposing the photoresist layer 7, exposed portions of the photoresist layer 7 being the portions of the photoresist layer 7 respectively located in the plurality of openings K; developing the photoresist layer 7 and etching the sacrificial layer 6 in sequence to remove the portion of the sacrificial layer 6 and the portion of the photoresist layer 7 that cover the pixel defining layer 3, so that the portions of the sacrificial layer 6 respectively located in the plurality of openings K and the portions of the photoresist layer 7 respectively located in the plurality of openings K are retained.

Here, both the portions of the sacrificial layer 6 respectively located in the plurality of openings K and the portions of the photoresist layer 7 respectively located in the plurality of openings K have shapes corresponding to shapes of the plurality of openings K. For example, each opening K has a shape as shown in FIG. 9D, and the portions of the sacrificial layer 6 respectively located in the plurality of openings K and the portions of the photoresist layer 7 respectively located in the plurality of openings K may each have an inverted trapezoidal shape.

In some examples, the sacrificial layer 6 and the photoresist layer 7 are patterned, and the removed portions of the sacrificial layer 6 and the photoresist layer 7 that cover the pixel defining layer 3 only include a planar portion of the sacrificial layer 6 and a planar portion of the photoresist layer 7 that cover the side of the pixel defining layer 3 away from the backplane 1 and are in parallel to the backplane 1, and do not include inclined portions of the sacrificial layer 6 covering respective side walls of the pixel defining layer 3 at the openings K and inclined portions of the photoresist layer 7 covering respective side walls of the pixel defining layer 3 at the openings K.

In some other examples, the sacrificial layer 6 and the photoresist layer 7 are patterned, and the removed portions of the sacrificial layer 6 and the photoresist layer 7 that cover the pixel defining layer 3 include the planar portion of the sacrificial layer 6 and the planar portion of the photoresist layer 7 that cover the side of the pixel defining layer 3 away from the backplane 1 and are in parallel to the backplane 1, and at least part of the inclined portions of the sacrificial layer 6 covering respective side walls of the pixel defining layer 3 at the openings K and at least part of the inclined portions of the photoresist layer 7 covering respective side walls of the pixel defining layer 3 at the openings K. In this case, part or all of an inclined portion of the sacrificial layer 6 covering a side wall of the pixel defining layer 3 at an opening K may be removed, and part or all of an inclined portion of the photoresist layer 7 covering a side wall of the pixel defining layer 3 at an opening K may be removed.

Figure 9E:
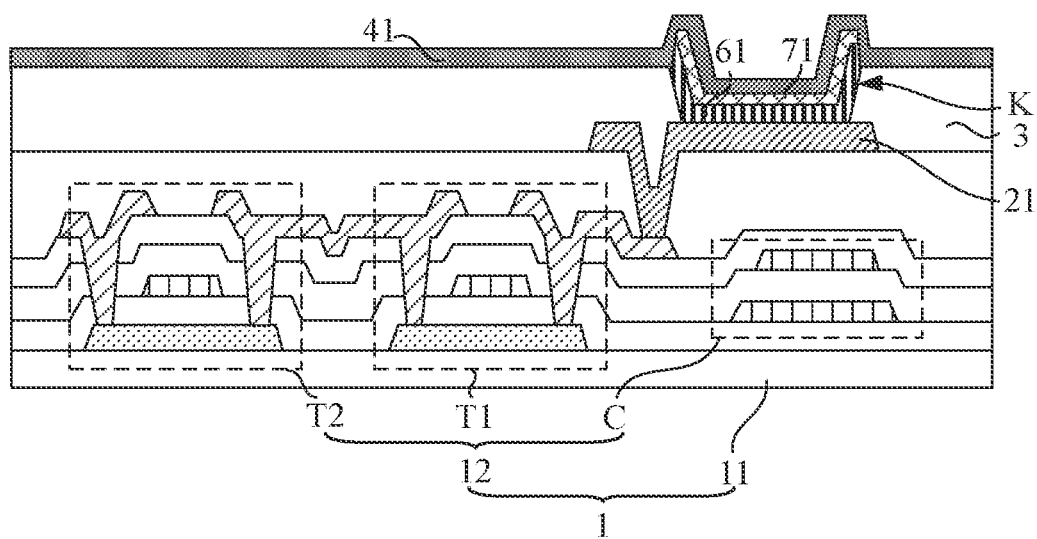

In S330a, as shown in FIG. 9E, a gas absorption film 41 is formed on a side of a retained photoresist layer 71 after patterning away from the backplane 1 and the side of the pixel defining layer 3 away from the backplane 1.

For example, the gas absorption film 41 may be formed by using a coating process (e.g., spin coating) or an ink jet printing (IJP) process. In addition, after the gas absorption film 41 is formed, the gas absorption film 41 may be cured by using a curing 3?process (including, for example, a high-temperature curing process) to stabilize the shape of the gas absorption film 41.

Figure 9F:
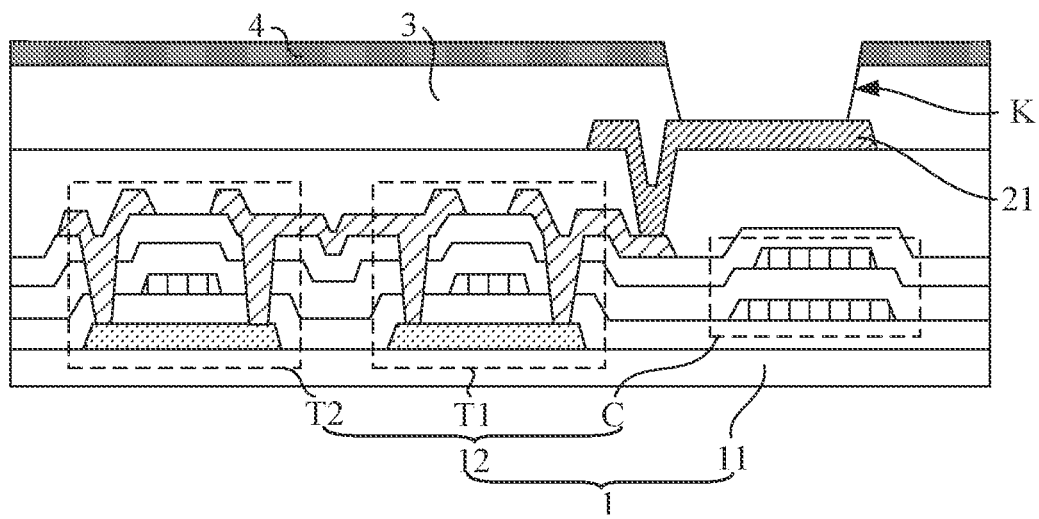

In S340a, as shown in FIG. 9F, a retained sacrificial layer 61 after patterning is peeled off to remove the retained sacrificial layer 61 after patterning, the retained photoresist layer 71 after patterning, and portions of the gas absorption film 41 respectively located in the plurality of openings K, so as to obtain the gas absorption layer 4.

For example, the display substrate to be formed on which the gas absorption film 41 is formed may be cleaned with a peeling liquid. The peeling liquid may pass through the gas absorption film 41 and the retained photoresist layer 71 after patterning to peel off the retained sacrificial layer 61 after patterning, so that the retained sacrificial layer 61 after patterning is peeled off, and the retained photoresist layer 71 after patterning and the portions of the gas absorption film 41 respectively located in the plurality of openings K are peeled off with the peeling of the retained sacrificial layer 61 after patterning. Thus, only a portion of the gas absorption film 41 located on the side of the pixel defining layer 3 away from the backplane 1 is retained, so that the gas absorption layer 4 is obtained.

Figure 9G:
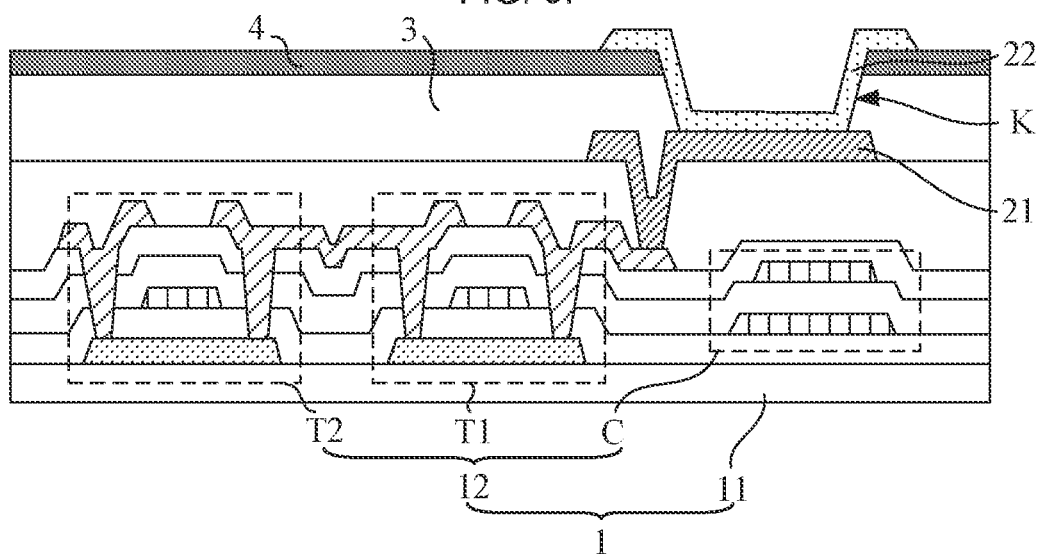

In S400, as shown in FIG. 9G, light-emitting layers 22 are formed on a side of the gas absorption layer 4 away from the backplane 1. The light-emitting layers 22 are each at least partially located in an opening K.

For example, the light-emitting layers 22 may be formed by using an IJP process or an evaporation process.

Beneficial effects that may be realized by the manufacturing method of the display substrate in some embodiments of the present disclosure are the same as the beneficial effects that may be realized by the display substrate 100 in some of the above embodiments, and will not be repeated here.

In addition, in the manufacturing method of the display substrate in some embodiments of the present disclosure, in a process of manufacturing the gas absorption layer 4, the retained sacrificial layer 61 after patterning is peeled off by using the peeling liquid, so that the gas absorption layer 4 may be obtained, and the process is simple and easy to operate, thereby being beneficial to avoiding increasing the manufacturing difficulty of the display substrate 100.

In some embodiments, the manufacturing method of the display substrate further includes: forming a light absorption layer 5 on the side of the gas absorption layer 4 away from the backplane 1 before the light-emitting layers 22 are formed.

In some examples, the gas absorption layer 4 and the light absorption layer 5 are formed in a same step, which is beneficial to simplifying the manufacturing process of the display substrate 100, and improving a production efficiency of the display substrate 100.

Figure 8:
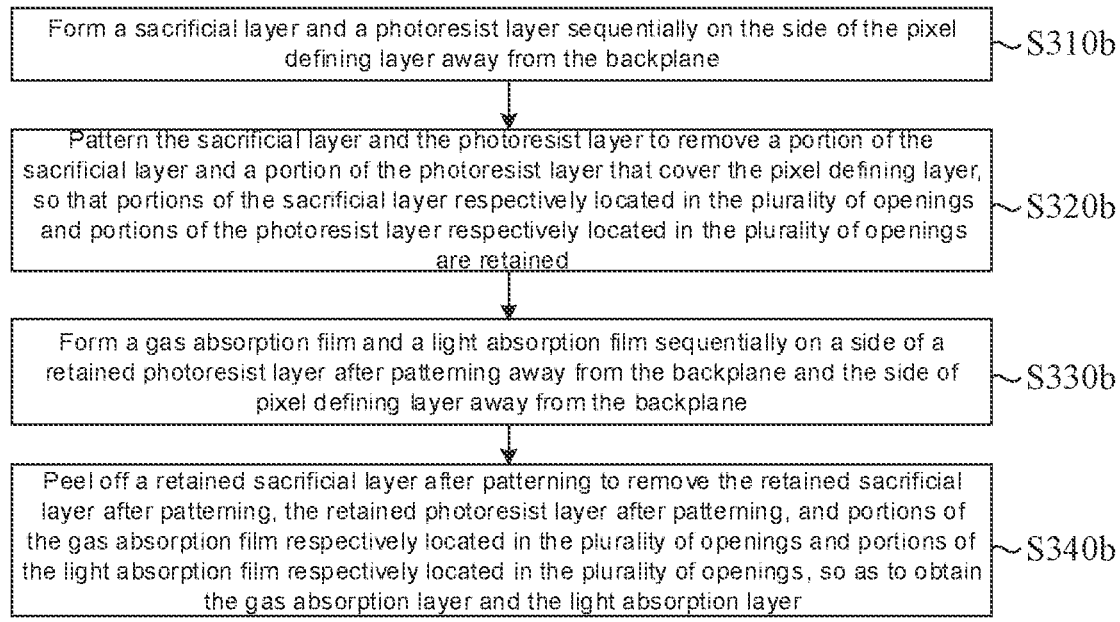
FIG. 8 is another flow diagram of S300 in FIG. 5.

For example, as shown in FIG. 8, the step of forming the gas absorption layer 4 and the light absorption layer 5 includes S310b to S340b.

In S310b, as shown in FIG. 9C, a sacrificial layer 6 and a photoresist layer 7 are sequentially formed on the side of the pixel defining layer 4 away from the backplane 1.

In S320b, as shown in FIG. 9D, the sacrificial layer 6 and the photoresist layer 7 are patterned to remove a portion of the sacrificial layer 6 and a portion of the photoresist layer 7 that cover the pixel defining layer 3, so that portions of the sacrificial layer 6 respectively located in the plurality of openings K and portions of the photoresist layer 7 respectively located in the plurality of openings K are retained.

Here, S310b and S320b may respectively refer to the schematic descriptions of S310a and S320a, and will not be repeated here.

In S330b, as shown in FIG. 10A, a gas absorption film 41 and a light absorption film 51 are sequentially formed on a side of a retained photoresist layer 71 after patterning away from the backplane 1 and the side of the pixel defining layer 3 away from the backplane 1.

Here, a process of forming the gas absorption film 41 may refer to S330a.

For example, after the gas absorption film 41 is formed, the pixel defining film 51 may be formed by using a coating process (e.g., spin coating) or an IP process. In addition, after the light absorption film 51 is formed, the light absorption film 51 may be cured by using a curing process (including, for example, a high-temperature curing process) to stabilize the shape of the light absorption film 51.

It will be noted that after the gas absorption film 41 is cured, the light absorption film 51 may be formed on a side of the gas absorption film 41 away from the backplane 1. In this way, a mixing of a material of the gas absorption film 41 and a material of the light absorption film 51 may be avoided.

In S340b, as shown in FIG. 10B, a retained sacrificial layer 61 after patterning is peeled off to remove the retained sacrificial layer 61 after patterning, the retained photoresist layer 71 after patterning, and portions of the gas absorption film 41 respectively located in the plurality of openings K and portions of the light absorption film 51 respectively located in the plurality of openings K, so as to obtain the gas absorption layer 4 and the light absorption layer 5.

Here, a process of peeling off the retained sacrificial layer 61 after patterning may refer to S340a. After the retained sacrificial layer 61 after patterning is peeled off, the retained photoresist layer 71 after patterning located on the side of the retained sacrificial layer 61 after patterning away from the backplane 1, the portions of the gas absorption film 41 respectively located in the plurality of openings K, and the portions of the light absorption film 51 respectively located in the plurality of openings K may be peeled off therewith. Thus, only a portion of the gas absorption film 41 and a portion of the light absorption film 51 that are located on the side of the pixel defining layer 3 away from the backplane 1 are retained, so that the gas absorption layer 4 and the light absorption layer are obtained.

In some embodiments, in an example where the first electrode layer 21 is the anode layer, before S400, the manufacturing method of the display substrate further includes: forming hole injection layers and/or hole transporting layers. A hole injection layer is at least partially located in an opening K, and/or a hole transporting layer is at least partially located in an opening K.

For example, the hole injection layers and/or the hole transporting layers may be formed by using an evaporation process.

In some embodiments, after S400, the manufacturing method of the display substrate further includes: forming electron transporting layers and/or electron injection layers. An electron transporting layer is at least partially located in an opening K, and/or an electron injection layer is at least partially located in an opening K.

For example, the electron transporting layers and the electron injection layers may be formed by using an evaporation process.

In some embodiments, after the electron transporting layers and/or the electron injection layers are formed, the manufacturing method of the display substrate further includes: forming a second electrode layer 23.

For example, the second electrode layer 23 may be formed by using an evaporation process.

Figure 11:
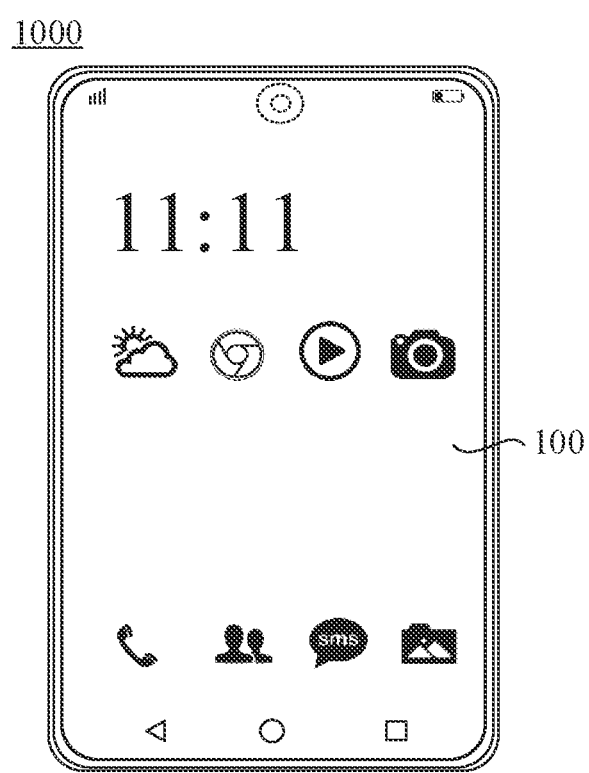
FIG. 11 is a structural diagram of a display device, in accordance with some embodiments of the present disclosure.

Some embodiments of the present disclosure further provide a display device 1000. As shown in FIG. 11, the display device 1000 includes the display substrate 100 in some of the above embodiments.

Beneficial effects that may be realized by the display device 1000 in some embodiments of the present disclosure are the same as the beneficial effects that may be realized by the display substrate 100 in some of the above embodiments, and will not be repeated here.

In some embodiments, the display device 1000 may be any device that displays images, whether moving (e.g., videos) or stationary (e.g., still images). It is anticipated that the embodiments may be implemented in, or associated with, a variety of electronic apparatuses. For example, the variety of electronic apparatuses are, but not limited to, mobile phones, wireless apparatuses, personal data assistants (PDAs), hand-held or portable computers, GPS receivers/navigators, cameras, moving picture experts group 4 (MP4) video players, video cameras, game consoles, watches, clocks, calculators, television monitors, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., displays for displaying an image of a piece of jewelry).

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
a backplane;
a pixel defining layer disposed on a side of the backplane, the pixel defining layer having a plurality of openings;
a gas absorption layer disposed on a side of the pixel defining layer away from the backplane, the gas absorption layer being configured to absorb a gas generated by the pixel defining layer due to an action of ultraviolet rays; the gas absorption layer exposing at least part of regions of the plurality of openings;
light-emitting layers each at least partially located in an opening in the plurality of openings; and
a light absorption layer disposed on a side of the gas absorption layer away from the backplane; wherein
an orthographic projection of the light absorption layer on the backplane is within an orthographic projection of the gas absorption layer on the backplane;
a thickness of the light absorption layer in a direction perpendicular to the backplane is in a range of approximately 0.05 µm to approximately 0.5 µm; and
the gas absorption layer completely covers side walls of the pixel defining layer at each of at least one opening in the plurality of openings.

2. The display substrate according to claim 1, wherein an orthographic projection of the gas absorption layer on the backplane substantially coincides with an orthographic projection of the pixel defining layer on the backplane.

3. The display substrate according to claim 2, wherein a thickness of the gas absorption layer in a direction perpendicular to the backplane is in a range of approximately 0.05 µm to approximately 0.5 µm.

4. The display substrate according to claim 1, wherein a material of the gas absorption layer includes at least one of ethylene/methyl acrylate/cyclohexenyl acrylate terpolymer, maleic anhydride esterified compound and ethylene diaminetetraacetic acid ferrous salt.

5. The display substrate according to claim 4, wherein a thickness of the gas absorption layer in a direction perpendicular to the backplane is in a range of approximately 0.05 µm to approximately 0.5 µm.

6. The display substrate according to claim 1, wherein a thickness of the gas absorption layer in a direction perpendicular to the backplane is in a range of approximately 0.05 µm to approximately 0.5 µm.

7. The display substrate according to claim 1, wherein the orthographic projection of the light absorption layer on the backplane is non-overlapped with orthographic projections of the light-emitting layers on the backplane.

8. The display substrate according to claim 1, wherein a material of the light absorption layer includes at least one of an acrylate prepolymer, an ultraviolet absorbent and titanium dioxide.

9. A display device comprising the display substrate according to claim 1.

10. A manufacturing method of a display substrate, comprising:

manufacturing a backplane;

forming a pixel defining layer on a side of the backplane; the pixel defining layer having a plurality of openings;

forming a gas absorption layer on a side of the pixel defining layer away from the backplane, the gas absorption layer being configured to absorb a gas generated by the pixel defining layer due to an action of ultraviolet rays; the gas absorption layer exposing at least part of regions of the plurality of openings;

forming light-emitting layers on a side of the gas absorption layer away from the backplane, the light-emitting layers being each at least partially located in an opening in the plurality of openings; and forming a light absorption layer on the side of the gas absorption layer away from the backplane before the light-emitting layers are formed;

wherein an orthographic projection of the light absorption layer on the backplane substantially coincides with an orthographic projection of the gas absorption layer on the backplane;

a thickness of the light absorption layer in a direction perpendicular to the backplane is in a range of approximately 0.05 μm to approximately 0.5 μm; and the gas absorption layer completely covers side walls of the pixel defining layer at each of at least one opening in the plurality of openings.

11. The manufacturing method of the display substrate according to claim 10, wherein an orthographic projection of the gas absorption layer on the backplane is within an orthographic projection of the pixel defining layer on the backplane, or an orthographic projection of the gas absorption layer on the backplane substantially coincides with an orthographic projection of the pixel defining layer on the backplane.

12. The manufacturing method of the display substrate according to claim 10, wherein forming the gas absorption layer, includes:

forming a sacrificial layer and a photoresist layer sequentially on the side of the pixel defining layer away from the backplane;

patterning the sacrificial layer and the photoresist layer to remove a portion of the pixel defining layer and a portion of the photoresist layer that cover the pixel defining layer, so that portions of the sacrificial layer respectively located in the plurality of openings and portions of the photoresist layer respectively located in the plurality of openings are retained;

forming a gas absorption film on a side of a retained photoresist layer after patterning away from the backplane and the side of the pixel defining layer away from the backplane; and peeling off a retained sacrificial layer after patterning to remove the retained sacrificial layer after patterning, the retained photoresist layer after patterning, and portions of the gas absorption film respectively located in the plurality of openings, so as to obtain the gas absorption layer.

13. The manufacturing method of the display substrate according to claim 10, wherein forming the gas absorption layer and the light absorption layer, includes:

forming a sacrificial layer and a photoresist layer sequentially on the side of the pixel defining layer away from the backplane;

patterning the sacrificial layer and the photoresist layer to remove a portion of the sacrificial layer and a portion of the photoresist layer that cover the pixel defining layer, so that portions of the sacrificial layer respectively located in the plurality of openings and portions of the photoresist layer respectively located in the plurality of openings are retained;

forming a gas absorption film and a light absorption film sequentially on a side of a retained photoresist layer after patterning away from the backplane and the side of pixel defining layer away from the backplane; and peeling off a retained sacrificial layer after patterning to remove the retained sacrificial layer after patterning, the retained photoresist layer after patterning, and portions of the gas absorption film respectively located in the plurality of openings and portions of the light absorption film respectively located in the plurality of openings, so as to obtain the gas absorption layer and the light absorption layer.

\* \* \* \* \*